(12) United States Patent
Phillips et al.

(10) Patent No.: US 11,675,681 B2
(45) Date of Patent: Jun. 13, 2023

(54) CONFIGURATION OF WEIGHTED ADDRESS POOLS FOR COMPONENT DESIGN VERIFICATION

(71) Applicant: International Business Machines Corporation, Armonk, NY (US)

(72) Inventors: Kyle Phillips, Poughkeepsie, NY (US); Daniel Gatlin Saconn, Lake Peekskill, NY (US); Cara Hanson, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 17/480,515

(22) Filed: Sep. 21, 2021

(65) Prior Publication Data

US 2023/0091566 A1 Mar. 23, 2023

(51) Int. Cl.
*G06F 11/22* (2006.01)
*G06F 30/3308* (2020.01)
*G06F 11/26* (2006.01)
*G06F 11/14* (2006.01)

(52) U.S. Cl.
CPC ........ *G06F 11/261* (2013.01); *G06F 11/1407* (2013.01); *G06F 11/2236* (2013.01); *G06F 30/3308* (2020.01)

(58) Field of Classification Search
CPC ............. G06F 11/1407; G06F 11/2242; G06F 11/261; G06F 11/2236; G06F 30/33; G06F 30/3308
See application file for complete search history.

(56) References Cited

U.S. PATENT DOCUMENTS

| 5,845,106 A | * | 12/1998 | Stapleton | G06F 30/33 703/2 |
| 6,117,181 A | * | 9/2000 | Dearth | G06F 30/33 703/22 |
| 6,178,533 B1 | * | 1/2001 | Chang | G06F 30/33 714/739 |

(Continued)

OTHER PUBLICATIONS

"PowerPC 601/604 Multiprocessor Random Verification Methodology," IP.Com No. IPCOM00011397D, Mar. 27, 2005, 6 pages.

*Primary Examiner* — Joseph O Schell
(74) *Attorney, Agent, or Firm* — Cantor Colburn LLP; Jeffrey Ingalls

(57) ABSTRACT

A system for testing a design of a computing component includes an input device configured to receive a request to perform a test of a component, and a testing unit including a simulation of the component. The simulation is configured to output a result indicative of a response to a set of instruction addresses, the set of instruction addresses is acquired from a plurality of addresses, and the plurality of addresses including a plurality of address groups, where each address group is associated with a respective group identifier. The system also includes a plurality of requestors configured to apply the set of instruction addresses to the simulation, where a requestor of the plurality of requestors is configured to select an address for application to the simulation based on a received group identifier and a variably configurable weight value assigned to the received group identifier and the requestor.

20 Claims, 5 Drawing Sheets

(56) References Cited

U.S. PATENT DOCUMENTS

| | | | |
|---|---|---|---|
| 7,386,434 B1* | 6/2008 | Cischke | G01R 31/318357 |
| | | | 703/14 |
| 7,823,132 B2 | 10/2010 | Ulrich et al. | |
| 10,108,514 B1* | 10/2018 | Kinderman | G06F 11/263 |
| 10,943,014 B2 | 3/2021 | Ventroux et al. | |
| 2003/0025490 A1* | 2/2003 | Chen | G11B 27/36 |
| | | | 714/E11.167 |
| 2004/0167764 A1 | 8/2004 | Wohl et al. | |
| 2005/0102572 A1* | 5/2005 | Oberlaender | G06F 30/33 |
| | | | 714/29 |
| 2012/0323549 A1* | 12/2012 | Bashteen | G06F 30/20 |
| | | | 711/119 |
| 2013/0218550 A1* | 8/2013 | Cummings | G06F 30/398 |
| | | | 703/21 |
| 2015/0254383 A1* | 9/2015 | Tso-Sheng | G06F 30/30 |
| | | | 716/107 |
| 2018/0260506 A1* | 9/2018 | Wood | G06F 30/3308 |
| 2019/0004912 A1* | 1/2019 | Gomes | G06F 11/263 |

* cited by examiner

CONFIGURATION OF WEIGHTED ADDRESS POOLS FOR COMPONENT DESIGN VERIFICATION

BACKGROUND

The present invention relates generally to computing device or component testing.

During pre-silicon testing and/or other testing of component designs, devices are tested in a virtual environment with various simulation, emulation, and formal verification tools. In contrast, post-silicon validation tests occur on actual devices running at-speed in commercial, real-world systems. Pre-silicon testing performs various tests to determine functional correctness and/or to assess the performance of the devices under test (DUT) and/or the system that includes such devices.

SUMMARY

According to an embodiment of the present invention, a system for testing a design of a computing component includes an input device configured to receive a request to perform a test of a component, and a testing unit including a simulation of the component. The simulation is configured to output a result indicative of a response to a set of instruction addresses, the set of instruction addresses is acquired from a plurality of addresses, and the plurality of addresses include a plurality of address groups, where each address group is associated with a respective group identifier. The system also includes a plurality of requestors configured to apply the set of instruction addresses to the simulation, where a requestor of the plurality of requestors is configured to select an address for application to the simulation based on a received group identifier and a variably configurable weight value assigned to the received group identifier and the requestor.

According to another embodiment of the present invention, a computer-implemented method of testing a design of a computing component includes receiving a request at a testing unit to perform a test of a component, the testing unit including a simulation of the component, and applying a set of instruction addresses to the simulation by a plurality of requestors. The set of instruction addresses is acquired from a plurality of addresses, the plurality of addresses includes a plurality of address groups, and each address group is associated with a respective group identifier. The applying includes receiving a group identifier by each requestor, at least one received group identifier associated with a variably configurable weight value, and selecting an address by each requestor from an address group based on a received group identifier. A requestor of the plurality of requestors is configured to select an address for application to the simulation based on a received group identifier and the weight value assigned to the received group identifier. The method also includes outputting a result indicative of a response of the simulation to the set of instruction addresses.

According to yet another embodiment of the present invention, a computer program product for testing a design of a computing component includes a computer readable storage medium having program instructions embodied therewith. The program instructions are executable by a processor to cause the processor to receive a request at a testing unit to perform a test of a component, the testing unit including a simulation of the component, and apply a set of instruction addresses to the simulation by a plurality of requestors. The set of instruction addresses is acquired from a plurality of addresses, the plurality of addresses include a plurality of address groups, and each address group is associated with a respective group identifier. The applying includes receiving a group identifier by each requestor, at least one received group identifier associated with a variably configurable weight value, and selecting an address by each requestor from an address group based on a received group identifier. A requestor of the plurality of requestors is configured to select an address for application to the simulation based on a received group identifier and the weight value assigned to the received group identifier. The program instructions are also executable to cause the processor to output a result indicative of a response of the simulation to the set of instruction addresses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
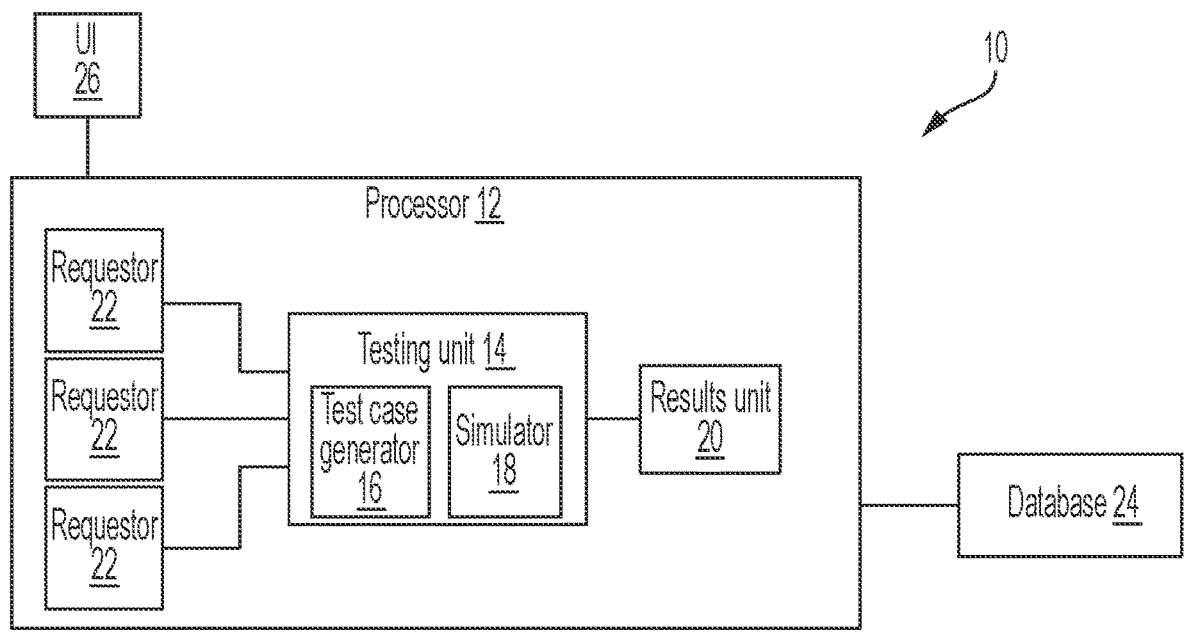
FIG. 1 is a block diagram illustrating an embodiment of a system for testing a component design.

The diagrams depicted herein are illustrative. There can be many variations to the diagram or the operations described therein without departing from the scope of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Systems, methods and computer program products are provided for testing and verification of component designs. An embodiment of a system includes a testing unit configured to receive a request to test a component design, and a plurality of requestors configured to target the component design using addresses selected from a plurality of pre-defined instruction addresses. The requestors apply various addresses to a simulation of the component to realize various test cases or test scenarios. For example, requestors can apply addresses to the simulation to cause address conflicts or resource contention. Although embodiments are described in the context of testing component simulations (e.g., pre-silicon testing and verification), the embodiments may also be used to apply test cases to physical components.

In an embodiment, the testing unit and/or other processor is configured to define a plurality of address groups or pools from which the requestors can select. An address group or address pool includes a group of addresses that have all been assigned or tagged with a common identifier (e.g., a numeric identifier), referred to herein as a group identifier. A user or other processor may configure the address groups in any desired manner. For example, address groups may be selected to include high contention addresses (addresses having a high probability of being simultaneously selected when the actual component is in use), low contention addresses and/or shared addresses.

During a testing process, requestors are each provided with one or more group identifiers that specify which address groups are to be selected from. In an embodiment, a requestor or requestors are each provided with a weight value (also referred to simply as a weight) that provides a likelihood or probability that a given group is selected. Each weight is assigned to a requestor and a specific group identifier. For example, when a testing process is initiated, a requestor is assigned one or more group identifiers, and a weight value is provided to the requestor and assigned to each group identifier (the weights may be the same for each requestor or different). Based on the provided group identifiers and associated weights, a requestor performs a weighted random selection process, in which the requestor randomly selects a group identifier based on the provided weights. The group identifiers and weight values (as well as which group identifiers are assigned to various requestors) are dynamically configurable, such that they can be changed or modified as desired. For example, the address groups can be reconfigured and/or weights adjusted based on user input, input of new test cases and/or simulation results.

Weights can be assigned using various criteria. For example, weights can be randomly assigned, or specific weight values may be provided by a user or other processor. In another example, weights can be provided to increase the likelihood that address groups of a given type (e.g., high contention groups) are selected by a requestor or multiple requestors. In this way, verification can be performed in which contention can be varied in numerous ways.

Embodiments described herein provide a number of advantages and technical effects. The embodiments allow for variation of test case scenarios and contention conditions over a range of addresses, and allows for variation of contention by types of requestors, types of addresses and requestor locations on a processor. The embodiments allow for a greater coverage of a component state space, provide for the ability to target specific test cases, and can test a component simulation by applying test cases that may not have been previously contemplated.

Processor simulations involve various methodologies for selecting memory addresses of instructions. Address selection may be used to test address conflicts between multiple instructions. Due to the large state space of processors, it can be difficult to effectively account for many cases of address conflict. Existing methodologies may not provide sufficient coverage of the state space, or may be overly focused on one area of the state space. The embodiments described herein present a solution to this problem by providing control over address selection and also providing a degree of randomization through the configuration of weighted address pools for requestors to draw from.

Advantages of embodiments described herein include the ability to create targeted testcases for very specific types of address configurations, including configurations including a combination of high-contention and low-contention addresses. In addition, the selection of address groups as described herein includes a degree of randomization, which can be employed to assign different groups of requestors to different address groups, resulting in exploration of a greater state space among tests. The ability to create specific types of conflicts with a degree of randomization allows for the generation of test cases or scenarios that may be too rare to see through purely random approaches and which may be difficult to pre-define in a test pattern. The above features and advantages result in more efficient coverage per test cycle and an improvement of the likelihood and speed at which hardware defects can be found.

FIG. 1 depicts an embodiment of a system 10 for simulation, testing and verification of component designs. The system 10 includes at least one processor 12, which may be part of a multi-processor system. In an embodiment, the system 10 is configured for testing simulations of components under test (e.g., pre-silicon testing and verification). Examples of components include various processing devices or units such as processor cores, memory, caches and others.

The processor 12 includes a testing and simulation unit 14 (also referred to as a testing unit) that is configured to receive data and/or instruction addresses and apply the addresses to generate a response of the simulated component. In an embodiment, the testing unit 14 includes a test pattern or test case generator 16 that outputs a selection of addresses to a simulator 18. The simulator 18 emulates a component under test and allows various test scenarios or test cases to be applied against the emulated component to stress the component and obtain the response of the component. Various types of simulators may be used, such as high level design simulators and cycle simulators. Outputs from the testing and simulation unit 14 may be provided to a results unit 20 for analysis of results, storage of results and/or for providing results to another device or system (e.g., workstation or other computer). Results may include performance data, such as performance counters, core all events traces (AETs), core nest traces, front side traces, and back side traces.

The processor 12 also includes a plurality of requestors 22, which are configured to select addresses from a plurality of addresses, and apply the selected addresses to the testing unit 14 and/or simulator 18 to stimulate or stress the simulated component and determine how well the component responds. The requestors 22 may select addresses from any suitable source. For example, the requestors 22 access addresses from an address database 24.

The system 10 may include any number of other components. For example, the system 10 includes a user interface (UI) 26 that can be used to receive testing parameters, test patterns, addresses and any other information relevant to the testing process.

Selection of addresses may be based on properties or attributes thereof, which may be received from a user via the user interface 26 or otherwise. Examples of address attributes include data patterns of interest (e.g., a lock byte being zero or non-zero), type of address (e.g., absolute, virtual, guest, host, etc.), location of address, the type of component or function that can use the address, directory state information, and others. Any information associated with an address can be designated as an attribute. In addition to (or in place of) address attributes, other selection criteria may be used, such as ranges of addresses and selected address pools discussed further herein.

In an embodiment, the system 10 is configured to perform testing and verification using an address selection process that includes organizing addresses into various address groups, and selecting addresses from the different address groups by requestors 22 when generating a test case. Each address group may include one or more addresses, and each address group is assigned a group identifier. Each address within a given address group is tagged or otherwise associated with the group identifier. An address group is also referred to as an "address pool," and a group identifier is also referred to as a "pool identifier."

The number of address pools, and the number of addresses per pool can be configured in any suitable manner. In addition, an address pool can include addresses having common or similar attributes, such as high contention addresses and low contention addresses. For example, a user (e.g., a verification engineer) can configure the number of pools and number of addresses per pool, for example, via the user interface 26. In addition, the pool configuration can be dynamically adjusted (e.g., by a user or the processor), on a real time basis or otherwise, based on results of simulations.

The system 10 is also configured to assign weight values or weights to pool identifiers that have been assigned to a requestor. Thus, a weight is specific to both a pool identifier and to a requestor. The weights may be assigned so that requestors select address pools according to specific likelihoods. This allows for different levels of address contention on different address pools and by different groups of requestors.

Each requestor is provided with information to allow it to access a plurality of addresses used in generating test cases, such as a common interface. In addition, each requestor is assigned to one or more address pools and stores a pool identifier for each assigned address pool. In an embodiment, each assigned address pool (or one or more address pools) for a given requestor is associated with a weight value that prescribes a likelihood that the requestor will select an address from that assigned address pool. For example, each requestor stores a pool identifier for each assigned address pool and also stores a weight value for each stored pool identifier, which may be a percentage, ratio or other value representing a likelihood that the requestor will select an address from that pool. The weight value may be randomly assigned, assigned based on user input, or assigned so that desired test cases and scenarios are more likely.

In an embodiment, when a requestor queries a database or other group of addresses, the requestor randomly selects one identifier from the stored identifiers based on weights assigned thereto. A weight may indicate a likelihood that the requestor will select the corresponding identifier (and thus select an address from the address pool associated with the identifier). A requestor uses the weights to randomly select one of the address pools with the probability of selecting an address pool corresponding to the weight value.

Figure 2:
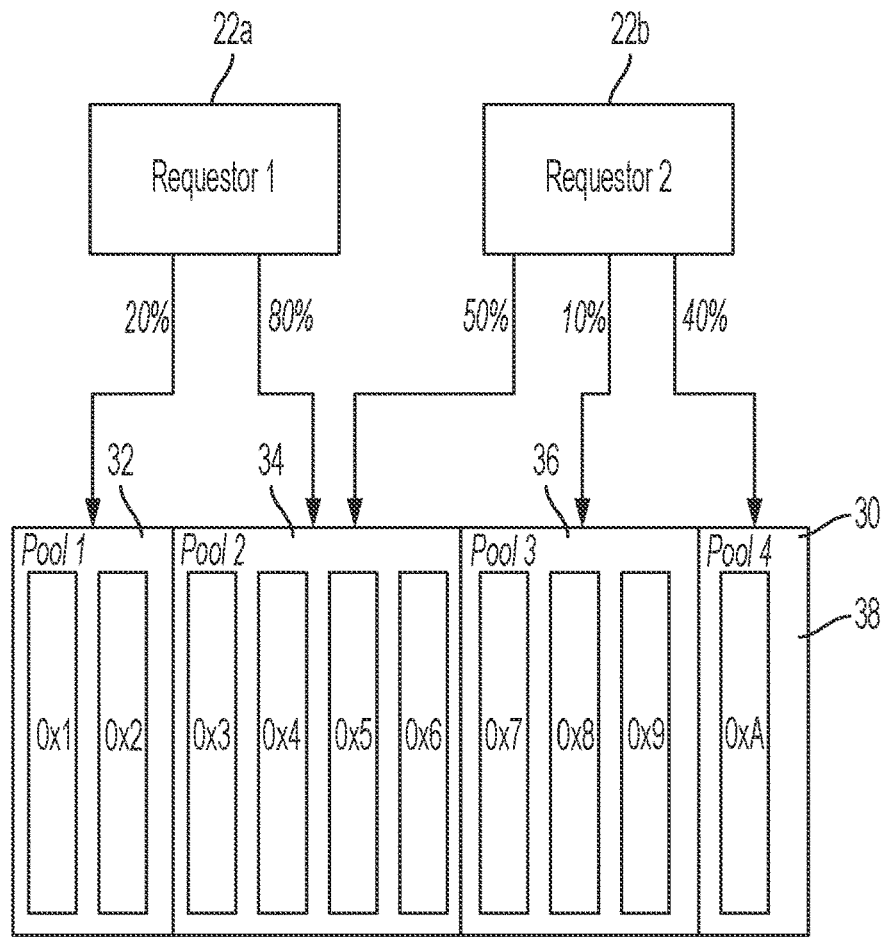
FIG. 2 depicts an example of parts of the testing system of FIG. 1.

FIG. 2 depicts an example of aspects of the system 10 and illustrates an examples of various address pools. The address pools may be stored in a common location (e.g., the database 26) or distributed among a number of locations. Likewise, individual addresses may be stored in one or more locations.

In this example, the testing unit 14 and/or other processor includes two requestors 22a and 22b, which have access to a plurality 30 of addresses, some or all of which may be stored in a database or other common location, or distributed among multiple locations. In this example, the addresses 30 are divided or partitioned into a plurality of address pools 32, 34, 36 and 38. As shown, pool 32 includes two addresses (0x1, 0x2), pool 34 includes four addresses, pool 36 includes three addresses, and pool 38 includes one address. Addresses are divided into pools by assigning a common group identifier to each address that is included in a pool.

In an embodiment, each requestor is provided with and stores a pool identifier for each of one or more address pools. The pool identifiers may be randomly assigned or based on a user specification of specific groups or types of groups. Each identifier stored by a requestor may be assigned a weight value that governs the frequency or probability that an identifier (and corresponding address group) is selected by the requestor. By assigning a high weight value, for example, the system ensures a high likelihood that a requestor will select an address from the associated pool, while still preserving an element of randomness. Assigning a pool identifier with a high weight value for multiple requestors ensures that simultaneous access to an address by multiple requestors will occur frequently, and the randomness element encourages types of contentions that may not have been previously contemplated or would be difficult to re-create.

In the example of FIG. 2, the requestor 22a stores pool identifiers for pools 32 and 34, and also stores a weight value with each identifier. A weight value of 20% is stored with the pool 32 identifier, and a weight value of 80% is stored with the pool 34 identifier. The requestor 22b stores pool identifiers for pools 34, 36 and 38. The requestor 22b stores a weight value of 50% with the pool 34 identifier, a weight value of 10% with the pool 36 identifier, and a weight value of 40% with the pool 38 identifier.

When the requestor 22a is prompted to retrieve an address, the requestor 22a randomly selects address pool 32 or 34 based on the weight values. Once an address pool is selected, the requestor 22a may randomly select an address within the selected address pool or select an address from the address pool using other criteria. In this example, there is a high likelihood that the requestors 22a and 22b will both select from pool 34, and thus over multiple cycles, a potentially large number of contentions will occur among addresses in the pool 34. However, due to the level of randomness in the selection process, various other contention scenarios will also be encountered.

Figure 3:
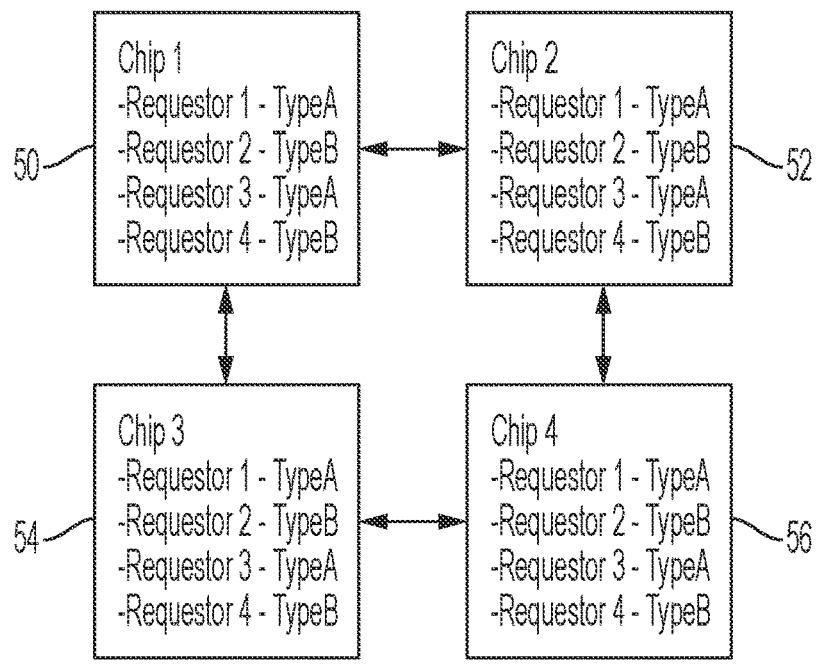
FIG. 3 depicts an example of a testing configuration that includes a plurality of requestors configured to select and apply addresses to a component simulation.

FIG. 3 depicts an example of address pools configured for testing units, and illustrates how selection of addresses can be configured based on requestor type and/or requestor location. In this example, a processing device includes four chips 50, 52, 54 and 56. Each chip stores four requestors (Requestors 1-4) that are configured to request addresses during testing. Requestors 1 and 3 are a first type (Type A), and Requestors 2 and 4 are of a second different type (Type B). Address pools and weights can be variably assigned to the requestors, for example, to target specific types of requestors, requestors at specific locations and/or addresses at specific locations. Requestors may be any distinct entities that can issue instructions or facilitate the issuance of instructions to a device or simulation under test or verification. Examples of requestors include core processing units, processor chips, input/output (I/O) interfaces, interfaces that abstract one or more entities that issue instructions, and others.

In this example, a plurality of addresses are divided into four pools, denoted as "Pool 1", "Pool 2", "Pool 3" and "Pool 4." Pool 1 is stored on chip 50 (in a level 3 cache), is enabled 100% of the time, and includes one to four addresses. Pool 2 is enabled 50% of the time, has up to four addresses and is stored on chip 52. Pools 1 and 2 are considered "hot" pools, which include addresses often used by a component, which can result in higher contention levels. Pool 3 is a shared pool, is enabled 50-80% of the time, is stored on each chip, and has up to thirty addresses. Pool 4 is enabled 100% of the time, has 50-60 addresses and is stored in a L3 cache of chip 50.

The following is an example of pool identifiers and weights assigned to requestors stored on the chips 50, 52, 54 and 56. Each requestor on the chip 50 is provided with pool identifiers for Pools 1-3. The Pool 1 identifier is assigned a weight of zero, the Pool 2 identifier is assigned a weight of one 50% of the time (i.e., 50% of testing cycles) and a weight of 300 50% of the time, and the Pool 3 identifier is assigned a weight of 50.

Each requestor on the chip 52 stores pool identifiers for each of Pools 1-4. The Pool 1 identifier is assigned a weight of one 50% of the time and a weight of 300 50% of the time, the Pool 2 identifier is assigned a weight of zero, the Pool 3 identifier is assigned a weight of 50, and the Pool 4 identifier is assigned a weight of 10. This examples is illustrative of the ability to control address selection based on the location of addresses.

The following examples are illustrative of the ability to control address selection based on the location of addresses and/or based on requestor type. In this example, the requestors of Type A on the chip 54, and requestors of Type B on the chip 56, are provided with identifiers and weights. Other requestors on these chips may also be assigned identifiers and weights, but are not discussed in this example. On the chip 54, Type A requestors store the Pool 1 and Pool 2 identifiers with a weight of one 90% of the time and a weight of 300 10% of the time, store the Pool 3 identifier with a weight of 50, and store the Pool 4 identifier with a weight of 10. On the chip 56, Type B requestors store the Pool 1 and Pool 2 identifiers with a weight of one 90% of the time and a weight of 300 10% of the time, and store the Pool 3 identifier with a weight of 50.

In an embodiment, the system and/or testing unit is equipped with a common interface that allows each requestor to access various address pools. An interface may include components for filtering addresses from a plurality of addresses based on a pool identifier.

Figure 4:
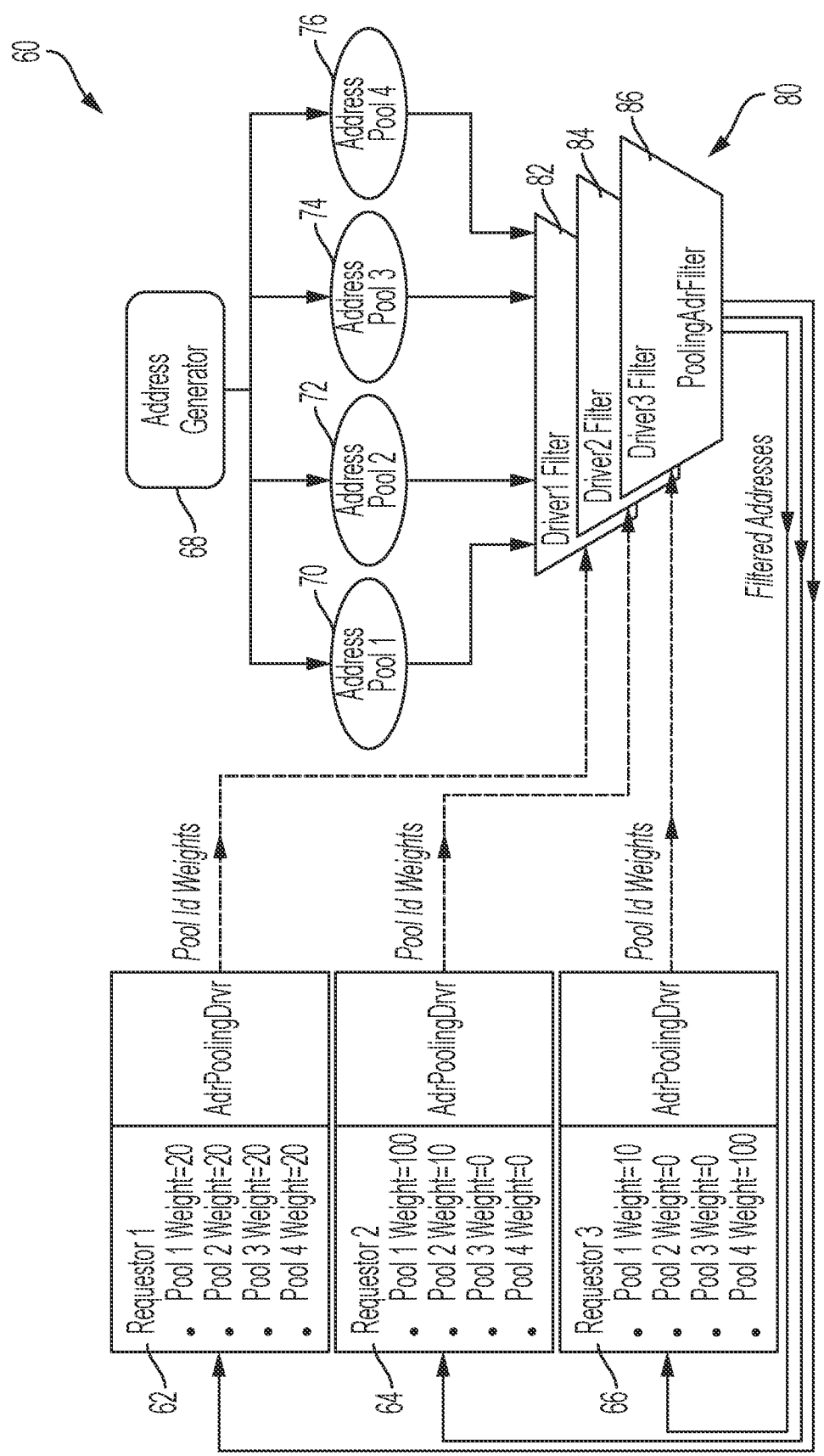
FIG. 4 depicts parts of an embodiment of a testing system that includes a common interface between a plurality of requestors and a plurality of addresses.

FIG. 4 depicts an example of aspects of a testing system 60 that includes an interface for requestors to select and query addresses. The testing system 60 shown may be part of the system 10 of FIG. 1.

In this example, the system 60 includes three requestors 62, 64 and 66 that have access to a plurality of addresses. The addresses may be provided by an address generator 68, which assigns each address to one of four address pools 70, 72, 74 and 76. The address generator 68 collects or generates various addresses based on factors such as user input, component design features, desired scenarios, etc. Each address in a given pool is assigned a common pool identifier (group identifier). For example, addresses in the pool 70 ("Pool 1") are assigned a Pool 1 identifier, addresses in the pool 72 ("Pool 2") are assigned a Pool 2 identifier, addresses in the pool 74 ("Pool 3") are assigned a Pool 3 identifier, and addresses in the pool 76 ("Pool 4") are assigned a Pool 4 identifier.

The system 60 also includes an interface 80 that is common to all of the requestors and address pools. The interface 80 includes a filter for each requestor, which operates to provide addresses from the plurality of addresses to a requestor based on a pool identifier. In this example, the interface 80 includes a filter 82 in communication with the requestor 62, a filter 84 in communication with the requestor 64, and a filter 86 in communication with the requestor 66. Each requestor (or driver) includes a common set of functionality (denoted "AdrPoolingDrvr") for interacting with the interface 80. When a requestor submits a pool identifier, the corresponding filter inspects the plurality of addresses and filters the addresses so that the addresses having the submitted pool identifier are provided to the requestor. The requestor then randomly selects one of the provided addresses.

FIG. 4 also illustrates an example of various weights that can be provided to each requestor. Each requestor stores a pool identifier for each address pool, and a weight is assigned to each stored pool identifier. In this example, the requestor 62 equally weights each pool identifier with a weight value of 20. The requestor 64 stores a Pool 1 identifier having an assigned weight of 100, and a Pool 2 identifier having an assigned weight of 10. The Pool 3 identifier and the Pool 4 identifier each have a weight of zero (i.e., the requestor 64 will not select Pools 3 or 4). The requestor 66 stores a Pool 1 identifier having an assigned weight of 10, Pool 2 and Pool 3 identifiers having an assigned weight of zero, and a Pool 4 identifier having an assigned weight of 100. It is noted that these weights may be adjusted at any time.

Figure 5:
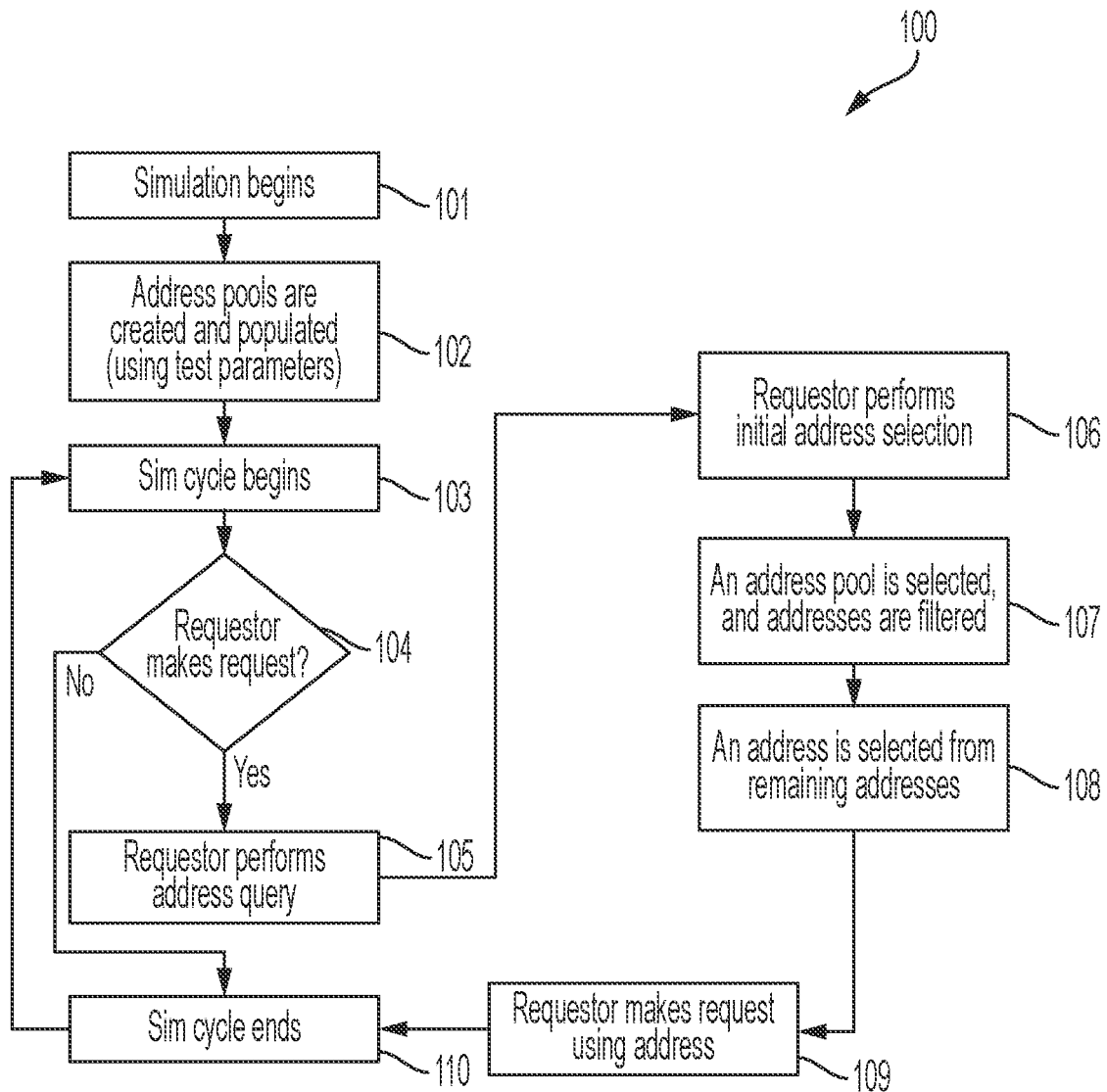
FIG. 5 is a block diagram of an embodiment of a method of testing a component design.

FIG. 5 depicts an embodiment of a method 100 of testing a component design. The method 100 includes a number of stages, aspects of which are represented by blocks 101-110. The stages may be performed in the order described, or one or more stages may be performed in a different order. In addition, the method 100 may include fewer than all of the stages. The method 100 is discussed in conjunction with the system 60 for illustrative purposes; however, the method 100 may be performed by any suitable processing device or system.

At block 101, the simulation is initiated in response to a request by a user. The user may input information regarding desired addresses, testing scenarios and other information. For example, a user may define one or more address attributes and/or scenarios of interest. Additionally, or alternatively, the user may input specific addresses and/or specify specific groups. Any number of attributes can exist and can be combined in many ways along with address values, data, and other information saved with the address. Other information that may be input include a number or range of numbers of address pools, and/or a number of addresses in a pool or pools. The number of pools and/or number of addresses per pool can be randomized over a range as defined by the user.

At block 102, address pools are created and populated using the input information. For example, the address generator 68 creates and populates address pools 70, 72, 74 and 76. Each address pool is assigned a pool identifier, and one or more pool identifiers are provided to each requestor. The pool identifiers stored by a given requestor specify from which pools an address can be selected from. Each requestor can use the pool identifiers provided thereto to select an address pool, e.g., by inputting a pool identifier to an interface such as the interface 80.

At block 103, a simulation cycle begins. During each simulation cycle, addresses are selected by each requestor (or a subset of requestors) and applied to a simulation to determine a response thereto.

When a requestor makes a request (block 104), the requestor performs an address query (block 105). As part of the query, in an embodiment, the requestor performs an initial address selection at block 106. The initial address selection includes a process of filtering all possible addresses down to a set which is relevant for a given test case. The initial address selection may include pre-filtering to determine a plurality of addresses which may be further filtered based on the address pool selection process at block 107.

At block 107, the requestor randomly selects one of the pool identifiers stored therein based on the assigned weights. The requestor then uses the selected identifier to retrieve an address pool from an address database or from any other suitable location. In an embodiment, a requestor accesses addresses via a common interface by inputting an identifier to the interface, which filters the available addresses to return addresses having the pool identifier. For example, the requestor 64 selects either Pool 1 or Pool 2 based on the assigned weights. In this example, it is likely that the requestor 64 will select Pool 1 in any given cycle.

At block 108, the requestor receives a list or other data indicative of the addresses associated with the selected pool identifier. The requestor then randomly selects an address from the addresses and applies the address to a simulation of a component. Aspects of the method are repeated for each requestor, and a test case including the addresses selected by each requestor in a cycle is applied to the simulation.

Figure 6:
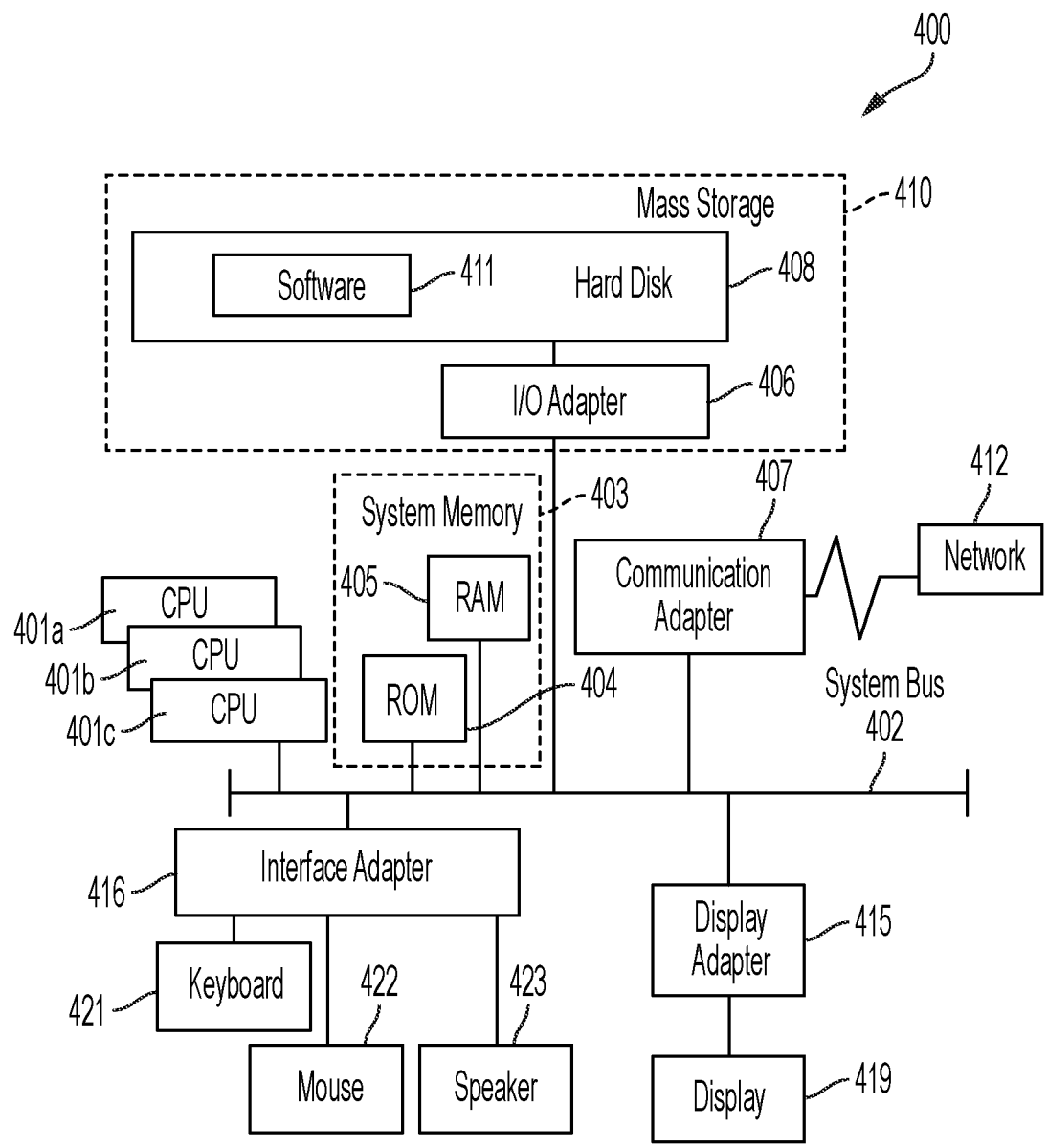
FIG. 6 depicts a block diagram of a processing system for implementing the presently described techniques according to one or more embodiments described herein.

It is understood that one or more embodiments described herein is capable of being implemented in conjunction with any other type of computing environment now known or later developed. Referring to FIG. 6, a computer system 400 is generally shown in accordance with an embodiment. The computer system 400 can be an electronic, computer framework comprising and/or employing any number and combination of computing devices and networks utilizing various communication technologies, as described herein. The computer system 400 can be easily scalable, extensible, and modular, with the ability to change to different services or reconfigure some features independently of others. The computer system 400 may be, for example, a server, desktop computer, laptop computer, tablet computer, or smartphone. In some examples, computer system 400 may be a cloud computing node. Computer system 400 may be described in the general context of computer system executable instructions, such as program modules, being executed by a computer system. Generally, program modules may include routines, programs, objects, components, logic, data structures, and so on that perform particular tasks or implement particular abstract data types. Computer system 400 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, the computer system 400 has one or more central processing units (CPU(s)) 401a, 401b, 401c, etc. (collectively or generically referred to as processor(s) 401). The processors 401 can be a single-core processor, multi-core processor, computing cluster, or any number of other configurations. The processors 401, also referred to as processing circuits, are coupled via a system bus 402 to a system memory 403 and various other components. The system memory 403 can include a read only memory (ROM) 404 and a random access memory (RAM) 405. The ROM 404 is coupled to the system bus 402 and may include a basic input/output system (BIOS), which controls certain basic functions of the computer system 400. The RAM is read-write memory coupled to the system bus 402 for use by the processors 401. The system memory 403 provides temporary memory space for operations of said instructions during operation. The system memory 403 can include random access memory (RAM), read only memory, flash memory, or any other suitable memory systems.

The computer system 400 comprises an input/output (I/O) adapter 406 and a communications adapter 407 coupled to the system bus 402. The I/O adapter 406 may be a small computer system interface (SCSI) adapter that communicates with a hard disk 408 and/or any other similar component. The I/O adapter 406 and the hard disk 408 are collectively referred to herein as a mass storage 410.

Software 411 for execution on the computer system 400 may be stored in the mass storage 410. The mass storage 410 is an example of a tangible storage medium readable by the processors 401, where the software 411 is stored as instructions for execution by the processors 401 to cause the computer system 400 to operate, such as is described herein with respect to the various Figures. Examples of computer program product and the execution of such instruction is discussed herein in more detail. The communications adapter 407 interconnects the system bus 402 with a network 412, which may be an outside network, enabling the computer system 400 to communicate with other such systems. In one embodiment, a portion of the system memory 403 and the mass storage 410 collectively store an operating system, which may be any appropriate operating system, such as the z/OS or AIX operating system from IBM Corporation, to coordinate the functions of the various components shown in FIG. 6.

Additional input/output devices are shown as connected to the system bus 402 via a display adapter 415 and an interface adapter 416. In one embodiment, the adapters 406, 407, 415, and 416 may be connected to one or more I/O buses that are connected to the system bus 402 via an intermediate bus bridge (not shown). A display 419 (e.g., a screen or a display monitor) is connected to the system bus 402 by a display adapter 415. A keyboard 421, a mouse 422, a speaker 423, etc. can be interconnected to the system bus 402 via the interface adapter 416, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 6, the computer system 400 includes processing capability in the form of the processors 401, and, storage capability including the system memory 403 and the mass storage 410, input means such as the keyboard 421 and the mouse 422, and output capability including the speaker 423 and the display 419.

In some embodiments, the communications adapter 407 can transmit data using any suitable interface or protocol, such as the internet small computer system interface, among others. The network 412 may be a cellular network, a radio network, a wide area network (WAN), a local area network (LAN), or the Internet, among others. An external computing device may connect to the computer system 400 through the network 412. In some examples, an external computing device may be an external webserver or a cloud computing node.

It is to be understood that the block diagram of FIG. 6 is not intended to indicate that the computer system 400 is to include all of the components shown in FIG. 4. Rather, the computer system 400 can include any appropriate fewer or additional components not illustrated in FIG. 16 (e.g., additional memory components, embedded controllers, modules, additional network interfaces, etc.). Further, the embodiments described herein with respect to computer system 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system for testing a design of a computing component, the system comprising:
   an input device configured to receive a request to perform a test of a component; and
   one or more processors including:
   a testing unit including a simulation of the component, the simulation configured to output a result indicative of a response to a set of instruction addresses, the set of instruction addresses acquired from a plurality of addresses, the plurality of addresses including a plurality of address groups, each address group associated with a respective group identifier; and a plurality of requestors configured to apply the set of instruction addresses to the simulation, wherein a requestor of the plurality of requestors is configured to select an address for application to the simulation based on a received group identifier and a variably configurable weight value assigned to the received group identifier and the requestor.

2. The system of claim 1, wherein the requestor is configured to randomly select the address from an address group associated with the received group identifier.

3. The system of claim 1, wherein at least one of a number of address groups and a number of addresses in an address group is determined based on user-defined criteria.

4. The system of claim 1, wherein the requestor is configured to receive a first group identifier associated with a first address group and a first weight value, and receive a second group identifier associated with a second address group and a second weight value.

5. The system of claim 4, wherein the requestor is configured to select one of the first address group and the second address group according to a weighted random selection process based on the first weight value and the second weight value.

6. The system of claim 1, wherein the testing unit includes a common interface connected to the plurality of requestors and the plurality of instruction addresses.

7. The system of claim 6, wherein the common interface includes a filter assigned to each requestor, the filter configured to select addresses from the plurality of addresses having the received group identifier and present the selected addresses to the requestor.

8. A computer-implemented method of testing a design of a computing component, the method comprising:

receiving at a testing unit included within one or more processors, a request to perform a test of a component, the testing unit including a simulation of the component; and applying a set of instruction addresses to the simulation by a plurality of requestors included within the one or more processors, the set of instruction addresses acquired from a plurality of addresses, the plurality of addresses including a plurality of address groups, each address group associated with a respective group identifier, wherein the applying includes:

receiving a group identifier by each requestor, at least one received group identifier associated with a variably configurable weight value, and selecting an address by each requestor from an address group based on a received group identifier, wherein a requestor of the plurality of requestors is configured to select an address for application to the simulation based on a received group identifier and the weight value assigned to the received group identifier; and outputting a result indicative of a response of the simulation to the set of instruction addresses.

9. The method of claim 8, wherein the requestor is configured to randomly select the address from an address group associated with the received group identifier.

10. The method of claim 8, wherein at least one of a number of address groups and a number of addresses in an address group is determined based on user-defined criteria.

11. The method of claim 8, wherein the requestor is configured to receive a first group identifier associated with a first address group and a first weight value, and receive a second group identifier associated with a second address group and a second weight value.

12. The method of claim 11, wherein the requestor is configured to select one of the first address group and the second address group according to a weighted random selection process based on the first weight value and the second weight value.

13. The method of claim 8, wherein the testing unit includes a common interface connected to the plurality of requestors and the plurality of instruction addresses.

14. The method of claim 13, wherein the common interface includes a filter assigned to each requestor, the filter configured to select addresses from the plurality of addresses having the received group identifier and present the selected addresses to the requestor.

15. A computer program product for testing a design of a computing component, the computer program product comprising a computer readable storage medium having program instructions embodied therewith, the program instructions executable by a processor to cause the processor to perform:

receiving at a testing unit included within one or more processors, a request to perform a test of a component, the testing unit including a simulation of the component; and applying a set of instruction addresses to the simulation by a plurality of requestors included within the one or more processors, the set of instruction addresses acquired from a plurality of addresses, the plurality of addresses including a plurality of address groups, each address group associated with a respective group identifier, wherein the applying includes:

receiving a group identifier by each requestor, at least one received group identifier associated with a variably configurable weight value, and selecting an address by each requestor from an address group based on a received group identifier, wherein a requestor of the plurality of requestors is configured to select an address for application to the simulation based on a received group identifier and the weight value assigned to the received group identifier; and outputting a result indicative of a response of the simulation to the set of instruction addresses.

16. The computer program product of claim 15, wherein the requestor is configured to randomly select the address from an address group associated with the received group identifier.

17. The computer program product of claim 15, wherein at least one of a number of address groups and a number of addresses in an address group is determined based on user-defined criteria.

18. The computer program product of claim 15, wherein the requestor is configured to receive a first group identifier associated with a first address group and a first weight value, and receive a second group identifier associated with a second address group and a second weight value.

19. The computer program product of claim 18, wherein the requestor is configured to select one of the first address group and the second address group according to a weighted random selection process based on the first weight value and the second weight value.

20. The computer program product of claim 15, wherein the testing unit includes a common interface connected to the plurality of requestors and the plurality of instruction addresses.

* * * * *